(12) United States Patent
Miller

(10) Patent No.: US 7,529,094 B2
(45) Date of Patent: May 5, 2009

(54) INTEGRATED HEAT SINK AND LIGHT PIPE MOUNTING ASSEMBLY

(75) Inventor: Jason J. Miller, Tower City, PA (US)

(73) Assignee: Tyco Electronics Corporation, Middletown, PA (US)

( * ) Notice: Subject to any disclaimer, the term of this patent is extended or adjusted under 35 U.S.C. 154(b) by 300 days.

(21) Appl. No.: 11/414,425

(22) Filed: Apr. 28, 2006

(65) Prior Publication Data

US 2007/0253168 A1    Nov. 1, 2007

(51) Int. Cl.
*H05K 7/20* (2006.01)
*F28F 7/00* (2006.01)
*G02B 6/36* (2006.01)

(52) U.S. Cl. ............... 361/715; 361/704; 361/719; 165/80.3; 165/185; 385/92

(58) Field of Classification Search .......... 361/704, 361/715; 257/718; 165/80.3; 174/16.3
See application file for complete search history.

(56) References Cited

U.S. PATENT DOCUMENTS

| 4,768,133 | A | * | 8/1988 | Simons et al. | 362/559 |
|---|---|---|---|---|---|
| 6,826,052 | B2 | * | 11/2004 | Ma | 361/709 |
| 7,355,857 | B2 | * | 4/2008 | Pirillis et al. | 361/715 |
| 2003/0161108 | A1 | * | 8/2003 | Bright et al. | 361/707 |
| 2003/0178943 | A1 | * | 9/2003 | Espiau et al. | 315/39 |
| 2005/0220425 | A1 | * | 10/2005 | Kropp et al. | 385/88 |
| 2006/0176666 | A1 | * | 8/2006 | Saturley et al. | 361/687 |

\* cited by examiner

*Primary Examiner*—Jayprakash N Gandhi
*Assistant Examiner*—Zachary M Pape

(57) ABSTRACT

A heat sink and light pipe assembly is provided for an electronic module configured to be mounted on a circuit board. The assembly includes a bracket configured to be held proximate the electronic module. The bracket includes a light pipe mounting post and the bracket defines an opening therein. A heat sink includes a base having a portion configured to extend through the opening in the bracket to engage the electronic module. A light pipe is held in the light pipe mounting post. The light pipe is configured to convey a status of the electronic module.

18 Claims, 6 Drawing Sheets

INTEGRATED HEAT SINK AND LIGHT PIPE MOUNTING ASSEMBLY

BACKGROUND OF THE INVENTION

The invention relates generally to pluggable devices and, more particularly, to thermal management in pluggable devices and the display of device status.

Transceiver modules are used for making bi-directional connections to communication devices such as modems, network interfaces, and other electronic modules or electrical systems such as computer systems and the like. The Small Form-Factor Pluggable (SFP) standard, which supports both fiber optic and copper based transceivers, includes specifications for transceivers that are reduced in size to achieve a higher port density. Typically, an SFP transceiver module is inserted into a complementary metal cage assembly that is mounted on a circuit board. In order to increase transceiver density on the circuit board, a stacked cage and connector system is sometimes used wherein the transceivers are arranged in rows and columns with each transceiver module plugged into a socket or receptacle in the cage.

The ongoing trend toward higher performance systems operating at higher signal speeds and higher port density has resulted in increased concerns for thermal management. Generally, the electronics commonly used to increase signal speeds also generate more heat. Multiplexing, which is commonly used in long distance transmissions, may also contribute to heat management issues, particularly in fiber optic systems including lasers that must be maintained at a certain operating temperature so that the laser operates at a particular frequency. In at least some applications, a heat sink is used to absorb and dissipate heat from the SFP module.

In some applications, a status indicator is provided to display the status of the SFP module or port. As the density of modules on circuit boards increases, it remains a challenge to accommodate the heat sink as well as the display of the port status in the space available on the circuit board.

BRIEF DESCRIPTION OF THE INVENTION

In one aspect, a heat sink and light pipe assembly is provided for an electronic module configured to be mounted on a circuit board. The assembly includes a bracket configured to be held proximate the electronic module. The bracket includes a light pipe mounting post and the bracket defines an opening therein. A heat sink includes a base having a portion configured to extend through the opening in the bracket to engage the electronic module. A light pipe is held in the light pipe mounting post. The light pipe is configured to convey a status of the electronic module.

Optionally, the assembly further includes a biasing member between the bracket and the heat sink that provides a force on the heat sink to enhance a thermal interface between the heat sink and the electronic module. The biasing member includes a lever arm that engages an upper surface of the heat sink base to provide a force on the heat sink. The bracket includes a forward end including a tab having an aperture and a rearward end including a latch. The biasing member has a forward end received in the aperture and a rearward end engaging the latch to retain the heat sink. The heat sink includes rows of heat dissipation elements extending from the heat sink base. The biasing member has lever arms that extend between the rows of heat dissipation elements to engage the heat sink base. The heat sink base includes a passageway through which the light pipe mounting post extends. The bracket includes downwardly extending side panels, each of which includes a retention element configured to engage a retention tab on a receptacle cage to attach the bracket to the receptacle cage.

In another aspect, a bracket for mounting for a heat sink and a light pipe to an electronic assembly including an electronic module is provided. The bracket includes an upper panel having a forward edge, a rearward edge, and opposed side panels. The upper panel defines an opening therein that provides access to the electronic module. A light pipe mounting post upwardly extends from the upper panel.

DETAILED DESCRIPTION OF THE INVENTION

Figure 1:
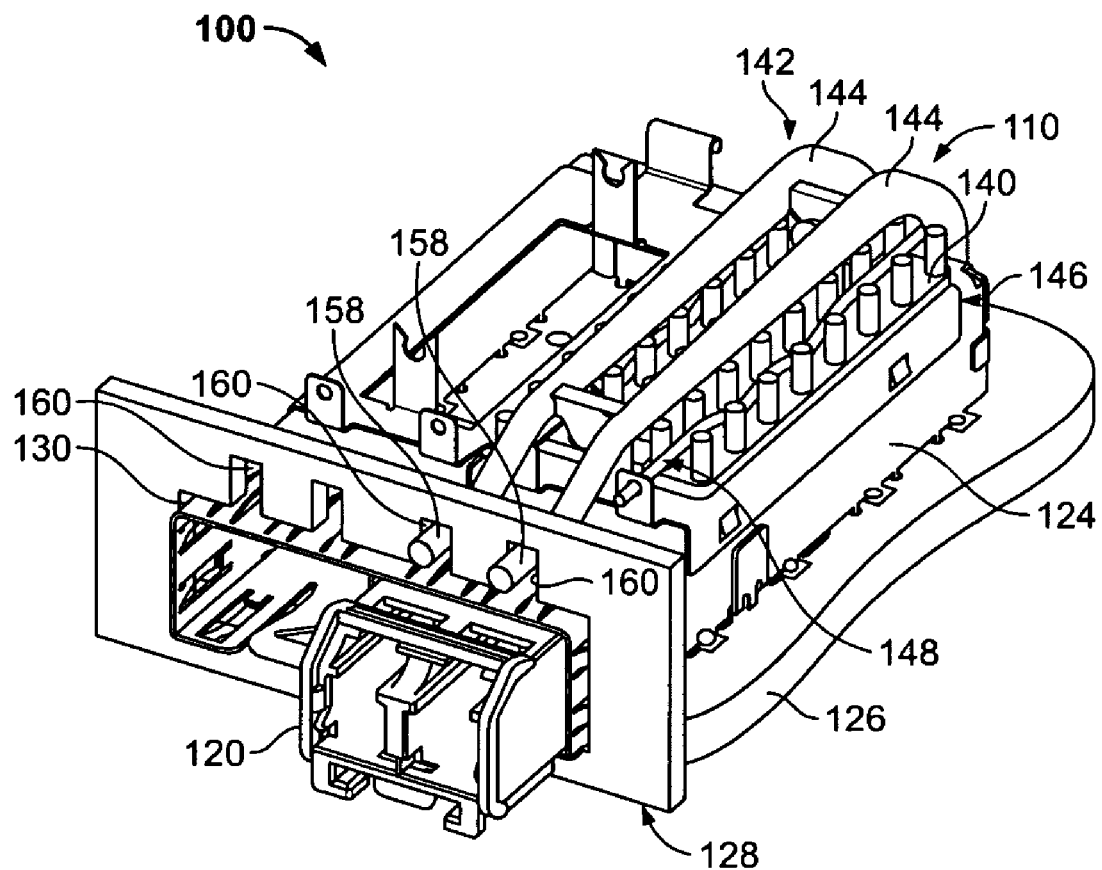
FIG. 1 is a perspective view of an electronic module assembly including a heat sink and light pipe assembly formed in accordance with an exemplary embodiment of the present invention.
Figure 2:
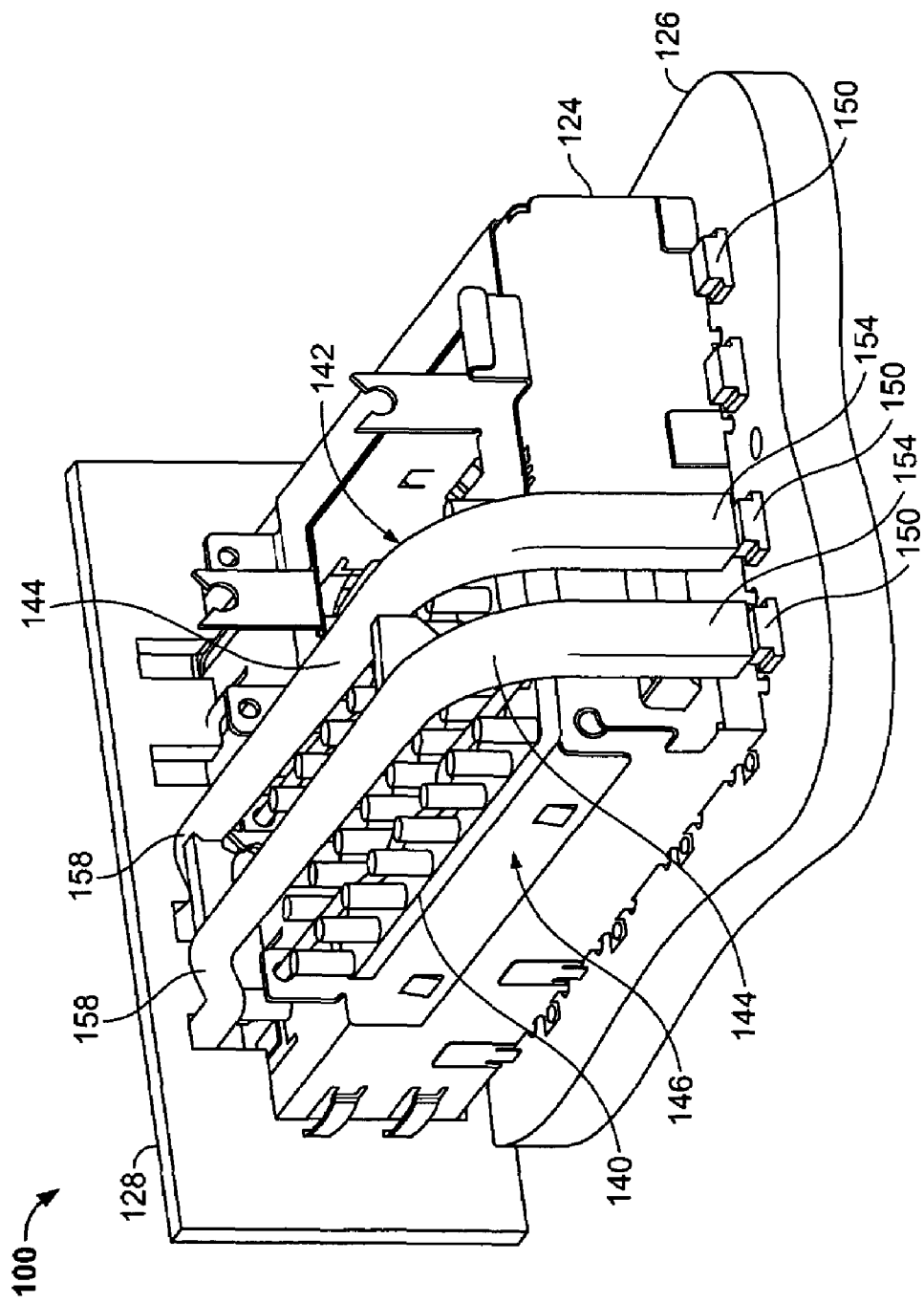
FIG. 2 is a rear perspective view of the assembly shown in FIG. 1.

FIG. 1 is a perspective view of an electronic module assembly 100 including a heat sink and light pipe assembly 110 formed in accordance with an exemplary embodiment of the present invention. FIG. 2 is a rear perspective view of the electronic module assembly 100. The assembly 100 includes an electronic module 120 that, in one embodiment, may be a Small Form Factor Pluggable (SFP) compliant transceiver module having high speed data transmission capability. It is to be understood, however, that the benefits and advantages of the invention may accrue equally to other types of electronic modules across a variety of systems and standards. Therefore, while the invention is described and illustrated in the context of assembly 100, the invention is not intended to be limited thereto and the assembly 100 is provided for purposes of illustration rather than limitation.

As shown in FIG. 1, the electronic module 120 is configured for pluggable insertion into a receptacle cage 124 that is mounted to a circuit board 126 which may be mounted in a host system (not shown). The host system includes a front panel or bezel 128 that includes an opening 130 through which the receptacle cage 124 extends. The receptacle cage 124 is electrically connected to the bezel 128. The electronic module 120 is inserted into the receptacle cage 124 through the bezel opening 130.

The heat sink and light pipe assembly 110 includes a heat sink 140 and a light pipe assembly 142 having a pair of light pipes 144. The heat sink 140 and the light pipe assembly 142 are mounted in a common bracket 146 that is itself mounted to the receptacle cage 124. The heat sink 140 is provided to dissipate thermal energy generated by electronic circuitry in the electronic module 120 through a thermal interface between the heat sink 140 and the electronic module 120. A biasing member 148 between the light pipe assembly 142 and the heat sink 140 retains the heat sink 140 in the bracket 146 and provides a downward force on the heat sink 140, in the direction of the arrow A (see FIG. 3), toward the receptacle cage 124 as will be described. The circuit board 126 includes status indicators 150 (FIG. 2) that provide an indication of a status of the assembly 100 such as, for instance, whether the electronic module 120 is operational or whether the electronic module 120 is sending or receiving data. In one embodiment, the status indicators 150 may be one or more light emitting diodes (LED's). Light pipes 144 each includes a rearward end 154 (FIG. 2) positioned to capture status indications from status indicators 150 and a forward end 158 proximate the bezel 128. The light pipes 144 convey the indication from the status indicators 150 to the bezel 128 for display. In the illustrated embodiment, the bezel 128 includes light pipe openings 160 that receive the forward ends 158 of the light pipes 144 so that the status indication can be read.

Figure 3:
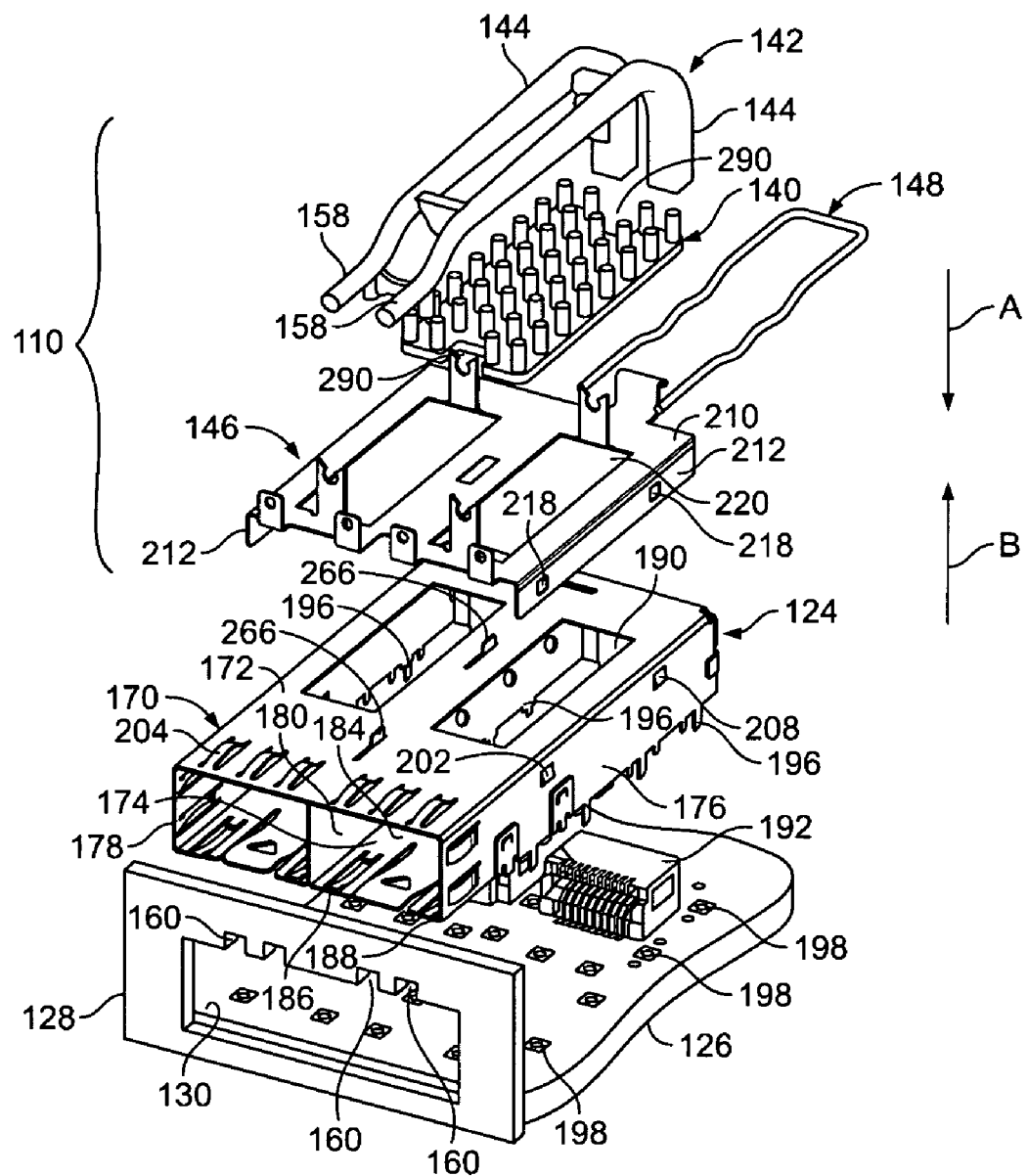
FIG. 3 is an exploded view of the assembly shown in FIG. 1 with the electronic module removed.

FIG. 3 is an exploded view of the electronic module assembly 100 shown in FIG. 1 with the electronic module 120 removed. The receptacle cage 124 includes a stamped and formed metal body 170 that defines a shell having a top wall 172, a bottom wall 174, and opposed side walls 176 and 178. As illustrated in FIGS. 1-3, the receptacle cage 124 is formed to accommodate two electronic modules 120 adjacent one another and separated by a dividing wall 180. The top wall 172, bottom wall 174, the side walls 176 and the dividing wall 180 define an interior cavity 184 for receiving the electronic module 120 (FIG. 1) through an opening 186 at a front end 188 of the receptacle cage 124. The top wall 172 includes an opening 190 into the cavity 184 that provides access to an upper surface (not shown) of the electronic module 120 when the electronic module is received in the cavity 184. The bottom wall 174 has a bottom opening (not shown) that receives a receptacle connector 192 on the circuit board 126. The receptacle connector 192 is configured to receive an edge of a circuit board (not shown) in the electronic module 120 to electrically connect the electronic module 120 to the host system when the electronic module is received in the receptacle cage 124. The side walls 176, 178 and the dividing wall 180 include compliant pin leads 196 that are received in through holes 198 in the circuit board 126 to mount the receptacle cage 124 and to provide a conductive path to ground for all sides of the receptacle cage 124. The side walls 176 and 178 also include retention tabs 202 provided for attachment and retention of the bracket 146. A plurality of flexible members 204 are provided proximate the front end 188 of the receptacle cage 124 to ground the receptacle cage 124 to the bezel 128 to enhance electromagnetic interference (EMI) shielding.

Figure 4:
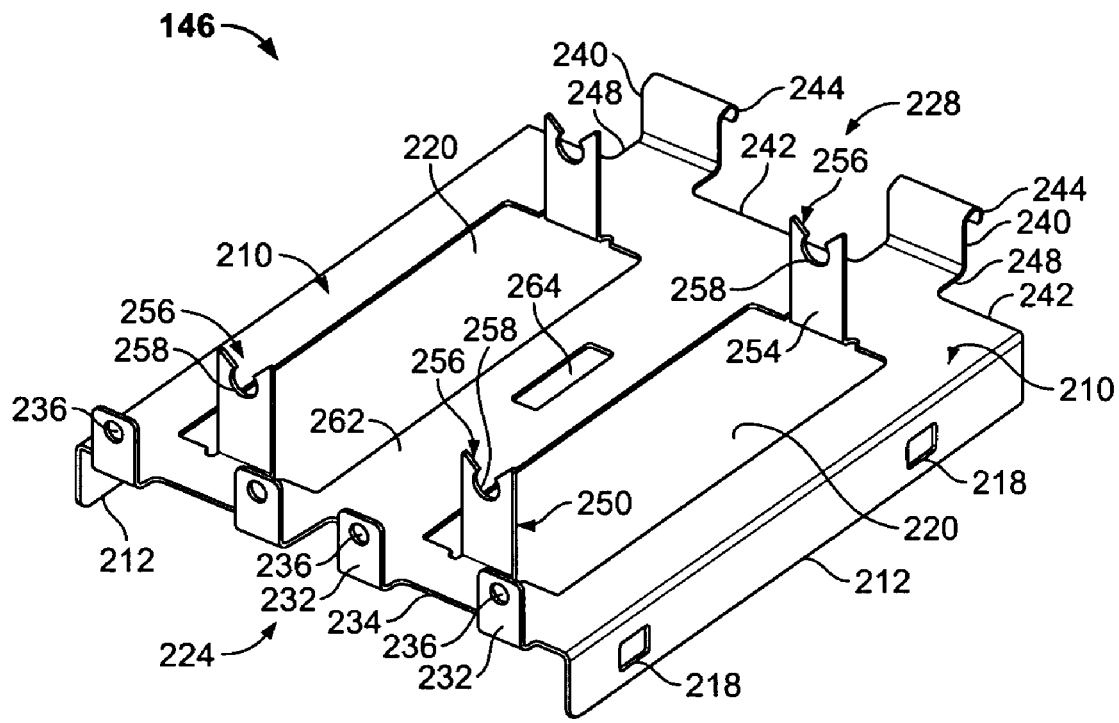
FIG. 4 is a perspective view of a bracket formed in accordance with an exemplary embodiment of the present invention.

With continued reference to FIG. 3, FIG. 4 is a perspective view of the bracket 146. In an exemplary embodiment, the bracket 146 is unitarily formed from a single sheet of metallic material that includes an upper panel 210 and side panels 212 that downwardly depend toward the receptacle cage 124 in the direction of the arrow A shown in FIG. 3. Side panels 212 include retention elements 218 that engage the retention tabs 202 to mount and retain the bracket 146 to the receptacle cage 124. The retention elements 218 and the retention tabs 202 cooperate to engage one another and securely retain the bracket 146 to the receptacle cage 124. In one embodiment, the retention elements 218 are windows that receive the retention tabs 202 with a snap fit. In other embodiments, retention elements 218 may take other well known forms, complementary to the retention tabs 202 that engage the retention tabs 202 with a secure fit. In the exemplary embodiment, retention elements 218 also position the bracket 146 on the receptacle cage 124.

The upper panel 210 is formed with an opening 220 that is at least partially coextensive with the opening 190 in the receptacle cage 124. The bracket 146 includes a forward end 224 a rearward end 228. Tabs 232 upwardly extend in a direction vertically upward from the receptacle cage 124 as indicated by the arrow B (FIG. 3) from a forward edge 234 of the upper panel 210. In the exemplary embodiment, tabs 232 include apertures 236 for retaining the biasing member 148 as will be described. Retaining latches 240 upwardly extend from a rearward edge 242 of the upper panel 210. Each retaining latch 240 has a retaining lip 244 formed thereon that also retains the biasing member 148. In some embodiments, retaining latches 240 may include a rearward extension 248 that projects from the rearward edge 242.

A light pipe mounting post 250 upwardly extends from the upper panel 210 proximate the forward end 224 of the bracket 146. A second light pipe mounting post 254 upwardly extends from the upper panel 210 proximate the rearward end 228 of the bracket 146. Each light pipe mounting post 250, 254, includes an upper end 256 having U-shaped receptacle 258. When the receptacle cage 124 is formed to accommodate adjacent electronic modules 120 as illustrated in FIG. 1, the bracket 146 is formed with a section 262 separating adjacent openings 220 in the upper panel 210. In such embodiments, the upper panel 210 may also be provided with at least one clearance slot 264 that provides clearance for dividing wall tabs 266 (FIG. 3).

Figure 5:
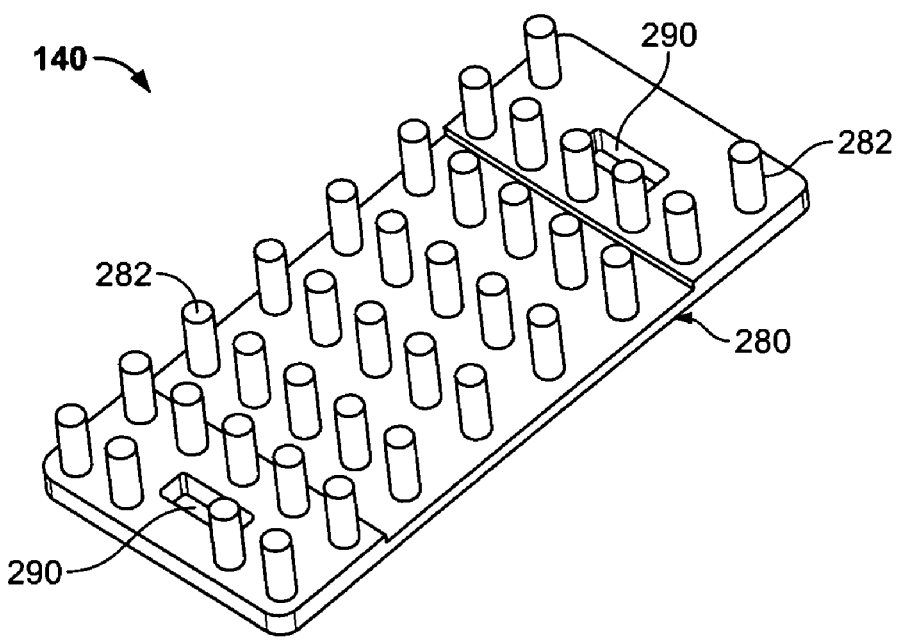
FIG. 5 is a perspective view of a heat sink formed in accordance with an exemplary embodiment of the present invention.
Figure 6:
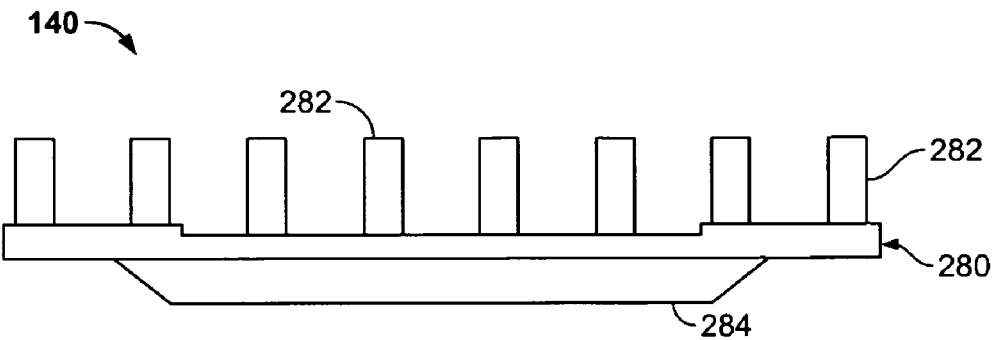
FIG. 6 is a side elevational view of the heat sink shown in FIG. 5.

FIG. 5 illustrates a perspective view of the heat sink 140. FIG. 6 illustrates a side elevational view of the heat sink 140. The heat sink 140 is provided to dissipate thermal energy generated by electronic circuitry in the electronic module 120 through a thermal interface between the heat sink 140 and the electronic module 120. The heat sink 140 includes a base 280 and a plurality of heat dissipation elements 282.

The base 280 includes a downwardly stepped portion 284 that is configured to extend downwardly through the bracket opening 220 and the receptacle cage opening 190 to engage a surface of the electronic module 120 (FIG. 1) to provide an enhanced thermal interface when the electronic module 120 is received in the receptacle cage 124. The stepped portion 284 of the heat sink base 280 extends within the interior cavity 184 of the receptacle cage 124 at a level that interferes with an installation path of the electronic module 120. The heat sink 140 is moved upward by the electronic module 120 when the electronic module 120 is installed to provide an abutting interface between the heat sink 140 and the electronic module 120.

The base 280 also includes passageways 290 configured to accommodate the pass through of the light pipe mounting posts 250, 254 (FIG. 4). In some embodiments, the passageways 290 comprise apertures that receive the light pipe mounting posts 250, 254. In other embodiments, the passageways 290 may comprise notched or cut-out portions (FIG. 3) to provide clearance for the light pipe mounting posts 250, 254.

Figure 7:
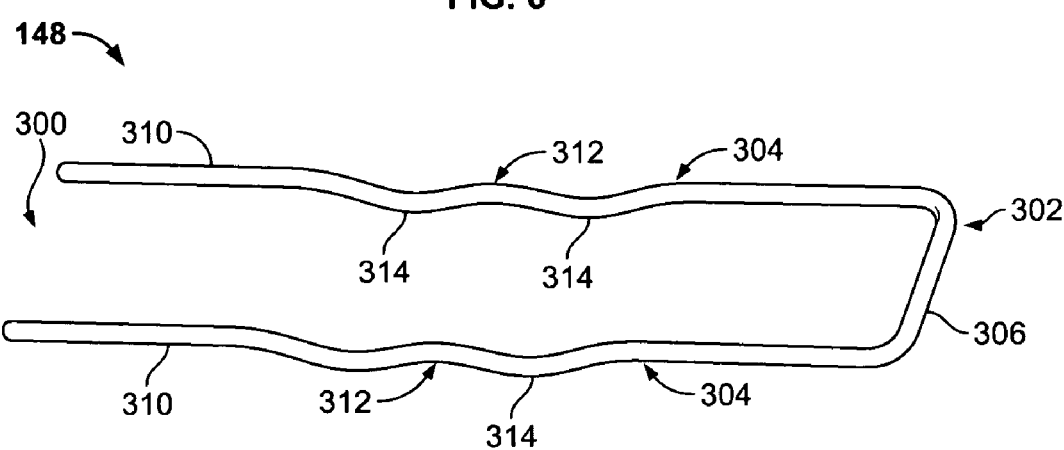
FIG. 7 is a perspective view of a biasing member formed in accordance with an exemplary embodiment of the present invention.
Figure 8:
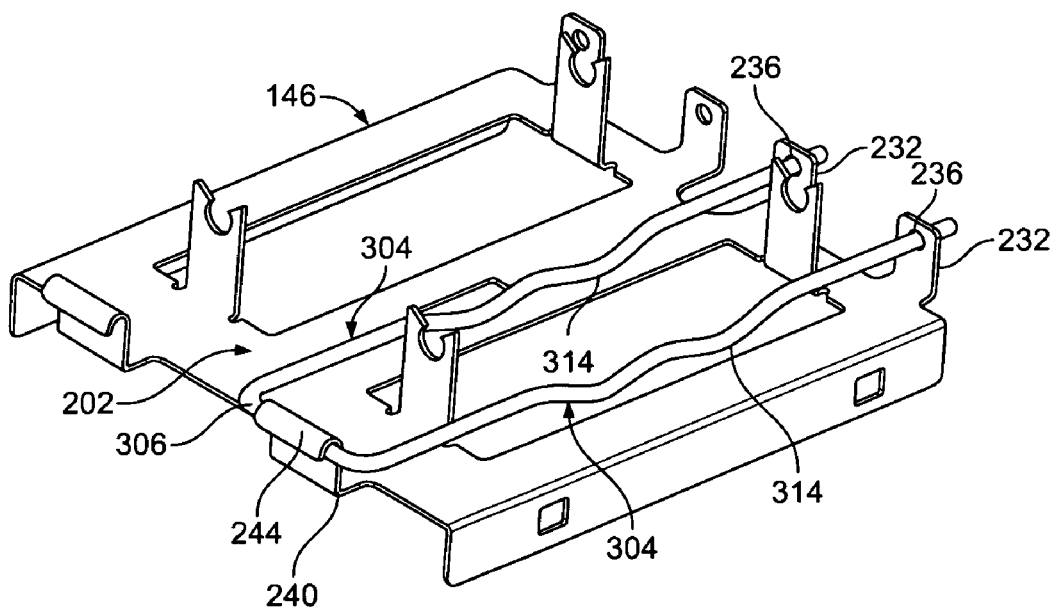
FIG. 8 is a perspective view of the biasing member of FIG. 7 installed on a bracket.

FIG. 7 illustrates a perspective view of the biasing member 148. FIG. 8 is a perspective view of the biasing member 148 installed on a bracket such as the bracket 146. The biasing member 148 has a forward end 300 and a rearward end 302. The biasing member 148 includes a pair of lever arms 304 extending from the forward end 300 to the rearward end 302. A cross member 306 joins the lever arms 304 at the rearward end 302. The lever arms 304 have forward ends 310 and a plurality of wave-like bends 312 between the forward ends 310 and the cross member 306. When installed on the bracket 146, the forward ends 310 of the lever arms 304 are received in the apertures 236 of the tabs 232 on the bracket 146. The lever arms 304 are positioned between the rows of heat dissipation elements 282 (see FIG. 1). The cross member 306 is placed under the lip 244 of the retaining latch 240 to retain the heat sink 140. The wave-like bends 312 include downward portions or contact points 314 that extend in the direction of the arrow A (FIG. 3) toward the receptacle cage 124 (FIG. 3). When the cross member 306 is latched under the lip 244, the biasing member 148 applies a downward force on the heat sink 140 at the contact points 314, thereby enhancing the thermal interface between the heat sink 140 and the electronic module 120. In alternative embodiments, biasing member 148 may be formed without wave-like bends 312 and contact points 314.

Figure 9:
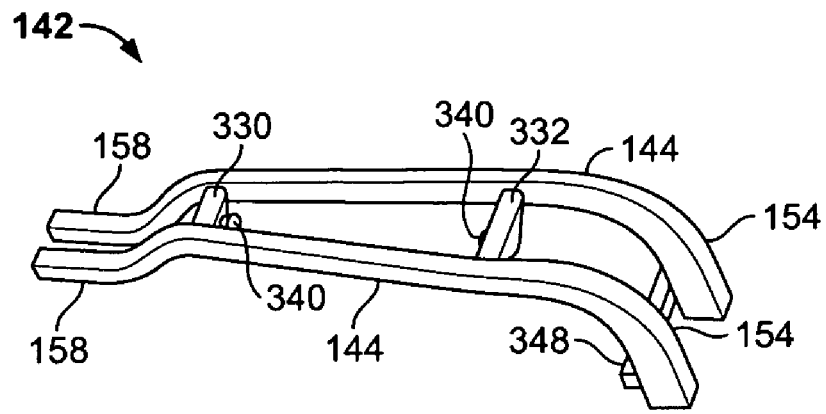
FIG. 9 is a perspective view of a light pipe assembly formed in accordance with an exemplary embodiment of the present invention.
Figure 10:
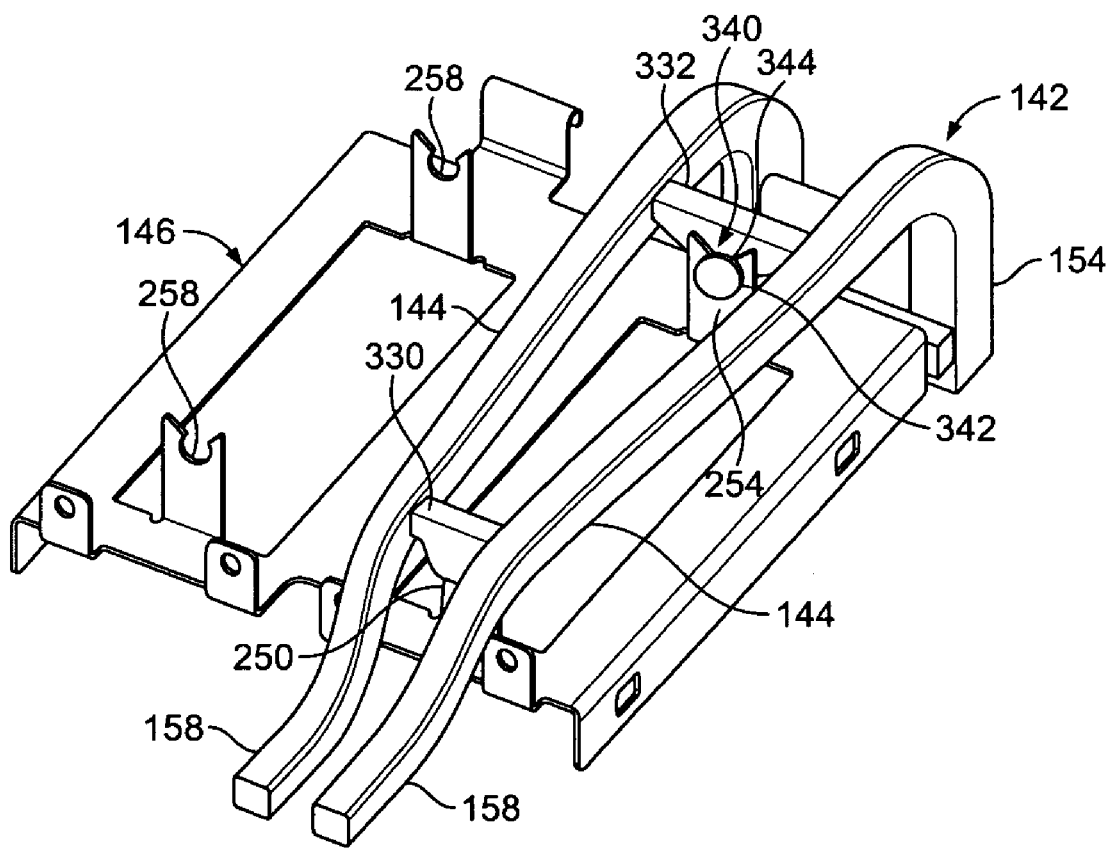
FIG. 10 is a perspective view of the light pipe assembly of FIG. 9 installed on a bracket.

FIG. 9 illustrates a perspective view of light pipe assembly 142. FIG. 10 illustrates a perspective view of the light pipe assembly 142 installed on a bracket such as the bracket 146. The light pipes 144 of the light pipe assembly 142 are configured to convey a status of the electronic module 120 from the status indicators 150 through the bezel 128 as shown in FIG. 2. The light pipe assembly 142 includes a first light pipe mounting member 330 proximate the forward ends 158 of the light pipes 144 and a second light pipe mounting member 332 spaced rearwardly from the first light pipe mounting member 330. Each mounting member 330, 332 includes a mounting button 340 that includes a head portion 342 and a section 344 having a reduced diameter that is sized to be received in the openings 258 in the light pipe mounting posts 250, 254. In an exemplary embodiment, the reduced diameter sections 344 of the mounting button are received in the light pipe mounting post openings 258 with an interference fit. The light pipe assembly also includes a stabilizing bar 348 positioned proximate the rearward ends 154 of the light pipes 144. The stabilizing bar 348 holds the rearward ends 154 of the light pipes together and aligned to pick up status indications from the status indicators 150.

The embodiments thus described provide a combined heat sink and light pipe mounting assembly 110 for use with an electrical system including an electronic module 120 mounted in receptacle cage 124. The assembly is particularly applicable to Small Form Factor Pluggable (SFP) applications. Light pipe mounting posts 250,254 extend through the heat sink 140. A biasing member applies a downward force to enhance a thermal interface between the heat sink and the electronic module. Light pipes convey a status indication of the SFP module to a front panel.

While the invention has been described in terms of various specific embodiments, those skilled in the art will recognize that the invention can be practiced with modification within the spirit and scope of the claims.

What is claimed is:

1. A heat sink and light pipe assembly for an electronic module configured to be mounted on a circuit board, said assembly comprising:
a bracket configured to be held proximate the electronic module, said bracket comprising a light pipe mounting post, said bracket defining an opening therein;
a heat sink including a base having a portion configured to extend through said opening in said bracket to engage the electronic module;
a light pipe held in said light pipe mounting post, said light pipe configured to convey a status of the electronic module; and
a biasing member between said light pipe and said heat sink, said biasing member providing a force on said heat sink to enhance a thermal interface between said heat sink and the electronic module.

2. The assembly of claim 1, wherein said biasing member includes a lever arm that engages an upper surface of said heat sink base to provide a force on said heat sink.

3. The assembly of claim 1, wherein said bracket further comprises a forward end including a tab having an aperture and a rearward end including a latch, and said biasing member has a forward end received in said aperture in said tab and a rearward end engaging said latch to retain said heat sink.

4. The assembly of claim 1, wherein said heat sink includes rows of heat dissipation elements extending from said heat sink base and said biasing member includes lever arms extending between said rows of heat dissipation elements to engage said heat sink base.

5. The assembly of claim 1, wherein said bracket further comprises a rearward end including a latch having a retaining lip, and said biasing member includes lever arms and a cross member joining said lever arms, said cross member engaging said lip to retain said heat sink.

6. The assembly of claim 1, wherein said heat sink base includes a passageway through which said light pipe mounting post extends.

7. The assembly of claim 1, wherein said bracket includes downwardly extending side panels, each side panel including a retention element configured to engage a retention tab on a receptacle cage to attach said bracket to the receptacle cage.

8. The assembly of claim 1, wherein said light pipe includes a rearward end positioned to receive an indication of a status of the electronic module, and a forward end positioned to display the electronic module status.

9. The assembly of claim 1, wherein said heat sink base portion is configured to extend through an opening in a receptacle cage that is at least partially coextensive with said bracket opening to engage the electronic module.

10. A bracket for mounting a heat sink and a light pipe to an electronic assembly including an electronic module, said bracket comprising:
an upper panel having a forward edge and a rearward edge and opposed side panels, said upper panel defining an opening therein that provides access to the electronic module;
a light pipe mounting post upwardly extending from said upper panel; and
a biasing member disposed between said light pipe and the heat sink, said biasing member including a lever arm for engaging an upper surface of the heat sink base to provide a force on the heat sink.

11. The bracket of claim 10 further including a tab upwardly extending from said forward edge of said upper panel and a retention latch upwardly extending from said rearward edge of said upper panel.

12. The bracket of claim 10, wherein said bracket opening is configured to receive a portion of the heat sink that is configured to also extend through an opening in a receptacle cage to engage the electronic module.

13. The bracket of claim 10 wherein said biasing member provides said force on the heat sink to enhance a thermal interface between the heat sink and the electronic module.

14. The bracket of claim 10 further including a tab upwardly extending from said forward edge of said upper panel, said tab including an aperture therein and a retention latch upwardly extending from said rearward edge of said upper panel, wherein said biasing member has a forward end received in said aperture in said tab and a rearward end engaging said latch, said biasing member configured to retain the heat sink.

15. The bracket of claim 10, wherein each said side panel includes a retention element configured to engage a retention tab on a receptacle cage to attach said bracket to the receptacle cage.

16. The bracket of claim 10 further including tabs upwardly extending from said forward edge of said upper panel, said tabs including apertures therein, and a retention latch upwardly extending from said rearward edge of said upper panel, said retention latch having a lip, wherein said biasing member has lever arms received in said apertures and a cross member joining said lever arms, said cross member engaging said lip, said biasing member configured to retain the heat sink.

17. The bracket of claim 10, wherein said light pipe mounting post includes an opening configured to receive a light pipe mounting button with an interference fit.

18. The bracket of claim 10, wherein said bracket is a unitary piece of metallic material.

\* \* \* \* \*